US012787821B2

(12) United States Patent
Hoegerl et al.

(10) Patent No.: US 12,787,821 B2
(45) Date of Patent: Nov. 3, 2026

(54) HIGH-SYMMETRICAL SEMICONDUCTOR ARRANGEMENT

(71) Applicant: HUAWEI TECHNOLOGIES CO., LTD., Shenzhen (CN)

(72) Inventors: Juergen Hoegerl, Weilheim (DE); Ruoyang Du, Dongguan (DE); Huibin Chen, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 519 days.

(21) Appl. No.: 18/469,355

(22) Filed: Sep. 18, 2023

(65) Prior Publication Data

US 2024/0006330 A1 Jan. 4, 2024

Related U.S. Application Data

(63) Continuation of application No. PCT/CN2021/081627, filed on Mar. 18, 2021.

(51) Int. Cl.

| | |
|---|---|
| ***H10W 70/65*** | (2026.01) |
| ***H10W 70/40*** | (2026.01) |
| ***H10W 70/60*** | (2026.01) |
| ***H10W 74/10*** | (2026.01) |
| ***H10W 90/00*** | (2026.01) |

(52) U.S. Cl.

CPC ......... *H10W 70/65* (2026.01); *H10W 70/442* (2026.01); *H10W 70/611* (2026.01); *H10W 70/614* (2026.01); *H10W 74/111* (2026.01); *H10W 90/00* (2026.01); *H10W 90/753* (2026.01); *H10W 90/763* (2026.01); *H10W 90/764* (2026.01)

(58) Field of Classification Search

CPC . H10W 44/00; H10W 90/753; H10W 72/534; H10W 70/442; H10W 70/614; H10D 48/38

See application file for complete search history.

(56) References Cited

U.S. PATENT DOCUMENTS

| | | | | |
|---|---|---|---|---|
| 10,692,806 | B2 | 6/2020 | Jakobi et al. | |
| 2019/0139880 | A1 * | 5/2019 | Jakobi | H10W 70/658 |

* cited by examiner

*Primary Examiner* — William B Partridge
*Assistant Examiner* — Alexandre X Ramirez
(74) *Attorney, Agent, or Firm* — Leydig, Voit & Mayer, Ltd.

(57) ABSTRACT

A semiconductor arrangement is provided, comprising: a substrate; a first group of semiconductor elements forming a first switch; a second group of semiconductor elements forming a second switch. The substrate comprises: a first electrically conductive area; a second electrically conductive area; a third electrically conductive area; a fourth electrically conductive area. The semiconductor arrangement further comprises: a first electrical connection line; a second electrical connection line; and a third electrical connection line. The first electrical connection line, the second electrical connection line, the third electrical connection line and the fourth electrically conductive area of the substrate are dimensioned according to a symmetry criterion to enable a simultaneous current flow through the load paths of the semiconductor elements of the first group as well as a simultaneous current flow through the load paths of the semiconductor elements of the second group.

19 Claims, 5 Drawing Sheets

HIGH-SYMMETRICAL SEMICONDUCTOR ARRANGEMENT

CROSS-REFERENCE TO RELATED APPLICATIONS

This application is a continuation of International Application No. PCT/CN2021/081627, filed on Mar. 18, 2021, the disclosure of which is hereby incorporated by reference in its entirety.

TECHNICAL FIELD

The present disclosure relates to the field of semiconductor arrangements, e.g. power semiconductor modules, capable of use in automotive, industrial and consumer electronic applications for driving loads, converting power, or the like. In particular the present disclosure relates to high symmetrical substrate layouts for semiconductor arrangements, for example, Silicon Carbide (SiC) based molded modules.

BACKGROUND

In a semiconductor arrangement with multiple semiconductor elements, the switching state of a controllable semiconductor element, e.g. whether the load path is electrically conducting or blocking, depends on its individual control voltage, i.e. on the difference between the electric potential of the control electrode and, e.g., the first load electrode of the corresponding controllable semiconductor element. A large current flowing through a line electrically connecting the first load electrodes can, in combination with the inevitable ohmic resistance and/or inductance of that line, lead to significantly different electric potentials at the first load electrodes of the different controllable semiconductor elements. Therefore, in some situations the switching states of different controllable semiconductor elements significantly differ from each other. That is, there are instants of time at which the load paths of some of the controllable semiconductor elements are electrically conducing, whereas the control paths of the remaining controllable semiconductor elements are electrically blocking. As a result, the electric load current through the controllable semiconductor elements having their load paths connected in parallel and, therefore, the thermal and electrical load caused by the electric load current are unevenly distributed among the controllable semiconductor elements. Hereby, the lifetime of the more heavily burdened controllable semiconductor elements may be reduced. Further, different switching states may arise from undesired interbody oscillations between the controllable semiconductor elements.

The described problems are, without being restricted to, of particular interest with regard to fast switching semiconductor elements like semiconductor elements based on silicon carbide (e.g. SiC-based MOSFETs or SiC-based IGBTs) because the silicon-carbide-based semiconductor chips presently available have small foot-print areas and, therefore, low rated currents so that there is a frequent requirement of electrically connecting silicon carbide based semiconductor chips in parallel.

SUMMARY

The present disclosure provides for semiconductor arrangements without the above described disadvantages.

The present disclosure provides for a semiconductor arrangement or a semiconductor assembly that reduces or prevents at least one of the above-described drawbacks that can occur when the load paths of two or more controllable semiconductor elements are operated in parallel.

A basic idea of this disclosure is to introduce symmetry into current flow on substrate and lead frame level.

This symmetric substrate concept can be advantageously applied to semiconductor arrangements of different size, for example such as 6 chips in parallel per switch.

This symmetric substrate concept can be advantageously applied to semiconductor arrangements of different sizes, for example such as 6 chips in parallel per switch.

Due to this specific configuration of the semiconductor arrangement 300, where the first electrical connection line 141, the second electrical connection line 143, the third electrical connection line 142 and the fourth area 134 of the substrate 101 are dimensioned according to a symmetry criterion, this configuration enables a simultaneous current flow 301, 302 through the load paths of the semiconductor elements of the first group 111, 114, 117 as well as a simultaneous current flow 301, 302 through the load paths of the semiconductor elements of the second group 121, 124, 127.

In order to describe the invention in detail, the following terms, abbreviations and notations will be used:

SiC silicon carbide

MOSFET metal oxide semiconductor field effect transistor

IGBT insulated gate bipolar transistor

According to a first aspect, the disclosure relates to a semiconductor arrangement, comprising: a substrate having a top side and a bottom side opposite to the top side; a first group of semiconductor elements forming a first switch, each semiconductor element of the first group comprising a load path formed between a first load electrode arranged on a first main surface of the semiconductor element and a second load electrode arranged on a second main surface opposite to the first main surface of the semiconductor element, wherein the first load electrode of each semiconductor element of the first group is placed on the top side of the substrate; a second group of semiconductor elements forming a second switch, each semiconductor element of the second group comprising a load path formed between a first load electrode arranged on a first main surface of the semiconductor element and a second load electrode arranged on a second main surface opposite to the first main surface of the semiconductor element, wherein the first load electrode of each semiconductor element of the second group is placed on the top side of the substrate; wherein the substrate comprises: a first electrically conductive area on the top side of the substrate, accommodating at least a first semiconductor element of the first group of semiconductor elements; a second electrically conductive area on the top side of the substrate, insulated from the first area, the second area accommodating at least a second semiconductor element of the first group of semiconductor elements; a third electrically conductive area on the top side of the substrate, insulated from the first area and the second area, the third area accommodating at least a third semiconductor element of the first group of semiconductor elements; a fourth electrically conductive area insulated from the first area, the second area and the third area, the fourth area accommodating at least a first semiconductor element, a second semiconductor element and a third semiconductor element of the second group of semiconductor elements; the semiconductor arrangement further comprising: a first electrical connection line configured to electrically connect the second load electrodes of the semiconductor elements of the first group with each other and with the fourth area of the substrate; a second electrical connection line configured to electrically connect the second load electrodes of the semiconductor elements of the second group with each other; and a third electrical connection line configured to electrically connect the first area, the second area and the third area of the substrate; wherein the first electrical connection line, the second electrical connection line, the third electrical connection line and the fourth area of the substrate are dimensioned according to a symmetry criterion to enable a simultaneous current flow through the load paths of the semiconductor elements of the first group as well as a simultaneous current flow through the load paths of the semiconductor elements of the second group.

Such a semiconductor arrangement can reduce or even prevent the above-described drawbacks that can occur when the load paths of two or more controllable semiconductor elements are operated in parallel.

The high symmetrical substrate layout enables reliable switching of the semiconductor elements. Such a reliable switching is particularly advantageous for SiC chips within the semiconductor arrangement and more particularly for a molded single side cooled module.

In an implementation of the semiconductor arrangement, the fourth area of the substrate is dimensioned to separate the first area, the second area and the third area of the substrate from each other.

This provides the advantage that the fourth area can be designed to isolate the first group of semiconductor elements from the second group of semiconductor elements, e.g. the high side switch from the low side switch.

In an implementation of the semiconductor arrangement, the fourth area of the substrate comprises a comb-shaped structure, wherein first teeth of the comb-shaped structure are dimensioned to separate the first area, the second area and the third area of the substrate from each other.

This provides the advantage that by such comb-shaped structure substrate area can be efficiently utilized to accommodate both groups of semiconductor elements.

In an implementation of the semiconductor arrangement, second teeth of the comb-shaped structure are dimensioned to accommodate the semiconductor element, the second semiconductor element and the third semiconductor element of the second group of semiconductor elements.

This provides the advantage that substrate space can be efficiently used to accommodate the second group of semiconductor elements by forming such second teeth.

In an implementation of the semiconductor arrangement, the second teeth of the comb-shaped structure are formed opposite to the first teeth of the comb-shaped structure. This provides the advantage of efficient utilization of substrate space.

In an implementation of the semiconductor arrangement, the second teeth of the comb-shaped structure are sequentially and equidistantly arranged on the top side of the substrate.

Besides efficient utilization of substrate space this provides the advantage of bridging between the teeth structures to exploit symmetry for the semiconductor elements.

In an implementation of the semiconductor arrangement, the first electrically conductive area, the second electrically conductive area and the third electrically conductive area are sequentially arranged on the top side of the substrate.

This provides the advantage of exploiting symmetry effects for simultaneously switching of the semiconductor elements.

In an implementation of the semiconductor arrangement, a distance between the first electrically conductive area and the second electrically conductive area on the top side of the substrate corresponds to a distance between the second electrically conductive area and the third electrically conductive area on the top side of the substrate.

This provides the advantage of providing a high symmetrical design for simultaneously switching of the semiconductor elements.

In an implementation of the semiconductor arrangement, the first electrical connection line comprises a first part configured to electrically connect the second load electrodes of the first semiconductor element, the second semiconductor element and the third semiconductor element of the first group of semiconductor elements with each other.

This provides the advantage that the first electrical connection line allows to simultaneously (or nearly simultaneously) establish a current path via the second load electrodes.

In an implementation of the semiconductor arrangement, the first part of the first electrical connection line is dimensioned to form a straight connection line with respect to the top side of the substrate.

This provides the advantage that this straight connection line allows to simultaneously establish the current path via the second load electrodes.

In an implementation of the semiconductor arrangement, the first electrical connection line comprises a second part configured to electrically connect the second load electrodes of another first semiconductor element arranged on the first electrically conductive area, another second semiconductor element arranged on the second electrically conductive area and another third semiconductor element arranged on the third electrically conductive area.

This provides the advantage that the first electrical connection line allows to simultaneously (or nearly simultaneously) establish a current path via the second load electrodes of the other semiconductor elements of the first group of semiconductor elements.

In an implementation of the semiconductor arrangement, the second part of the first electrical connection line is dimensioned to form a straight connection line with respect to the top side of the substrate.

This provides the advantage that this straight connection line allows to simultaneously establish the current path via the second load electrodes of the other semiconductor elements of the first group of semiconductor elements.

In an implementation of the semiconductor arrangement, the third electrical connection line is dimensioned to form a straight connection line with respect to the top side of the substrate.

This provides the advantage that this straight connection line allows to simultaneously establish the current path.

In an implementation of the semiconductor arrangement, the semiconductor arrangement comprises: a fifth electrically conductive area insulated from the first area, the second area, the third area and the fourth area, wherein the second electrical connection line is configured to electrically connect the second load electrodes of the semiconductor elements of the second group with the fifth area.

This provides the advantage that this fifth conductive area allows to simultaneously establish the current path via the second group of semiconductor elements, e.g. for the low side switch.

In an implementation of the semiconductor arrangement, the semiconductor arrangement comprises: a first lead frame configured to electrically connect the third area to a first external terminal, wherein the first lead frame is welded on the third area of the substrate; a second lead frame configured to electrically connect the fifth area to a second external terminal, wherein the second lead frame is welded on the fifth area of the substrate; and a third lead frame configured to electrically connect the fourth area to a second external terminal, wherein the third lead frame is welded on the fourth area of the substrate.

This provides the advantage that the first lead frame provides a high conductivity in order to carry high currents from the switch to the external terminal.

In an implementation of the semiconductor arrangement, the semiconductor arrangement comprises: a fourth lead frame configured to electrically connect the first area;

and an electrically conductive bridge configured to electrically connect the fourth lead frame with the first lead frame by bridging the second lead frame.

This provides the advantage that the fourth lead frame provides a high conductivity in order to carry high currents from the switch to the external terminal. The bridge provides the advantage of flexible design options due to connections of two lead frames via a third dimension. The bridge advantageously allows to use two lead frames at the same electrical potential in order to exploit symmetry.

In an implementation of the semiconductor arrangement, the semiconductor arrangement comprises: a mold compound embedding the first group of semiconductor elements, the second group of semiconductor elements, the first electrical connection line, the second electrical connection line and the third electrical connection line.

This provides the advantage that the mold compound protects the semiconductor arrangement from the outside.

In an implementation of the semiconductor arrangement, the semiconductor elements of the first group of semiconductor elements and the semiconductor element of the second group of semiconductor elements are Silicon Carbide semiconductors.

This provides the advantage that this design is well suited particularly for fast switching SiC semiconductors.

In an implementation of the semiconductor arrangement, the semiconductor arrangement is forming a single side cooled molded power module for automotive applications.

This provides the advantage that this semiconductor arrangement can be advantageously applied in automotive applications with high power semiconductors.

BRIEF DESCRIPTION OF THE DRAWINGS

Further embodiments of the invention will be described with respect to the following figures, in which.

DETAILED DESCRIPTION OF EMBODIMENTS

In the following detailed description, reference is made to the accompanying drawings, which form a part thereof, and in which is shown by way of illustration specific aspects in which the disclosure may be practiced. It is understood that other aspects may be utilized and structural or logical changes may be made without departing from the scope of the present disclosure. The following detailed description, therefore, is not to be taken in a limiting sense, and the scope of the present disclosure is defined by the appended claims.

It is understood that comments made in connection with a described method may also hold true for a corresponding device or system configured to perform the method and vice versa. For example, if a specific method step is described, a corresponding device may include a unit to perform the described method step, even if such unit is not explicitly described or illustrated in the figures. Further, it is understood that the features of the various aspects described herein may be combined with each other, unless specifically noted otherwise.

The semiconductor arrangements, devices and systems described herein may, for example, be implemented in automotive, industrial or consumer electronic applications, e.g. for driving loads, converting power, etc. The semiconductor arrangements, devices and systems described herein may also be implemented in wireless communication schemes, e.g. communication schemes according to 5G or WiFi, e.g. for Internet of Things, etc. The described semiconductor arrangements, devices and systems may be used to produce integrated circuits and/or power semiconductors and may be manufactured according to various technologies. For example, the semiconductor arrangements, devices and systems may be utilized in logic integrated circuits, analog integrated circuits, mixed signal integrated circuits, optical circuits, memory circuits and/or integrated passives.

Figure 1:
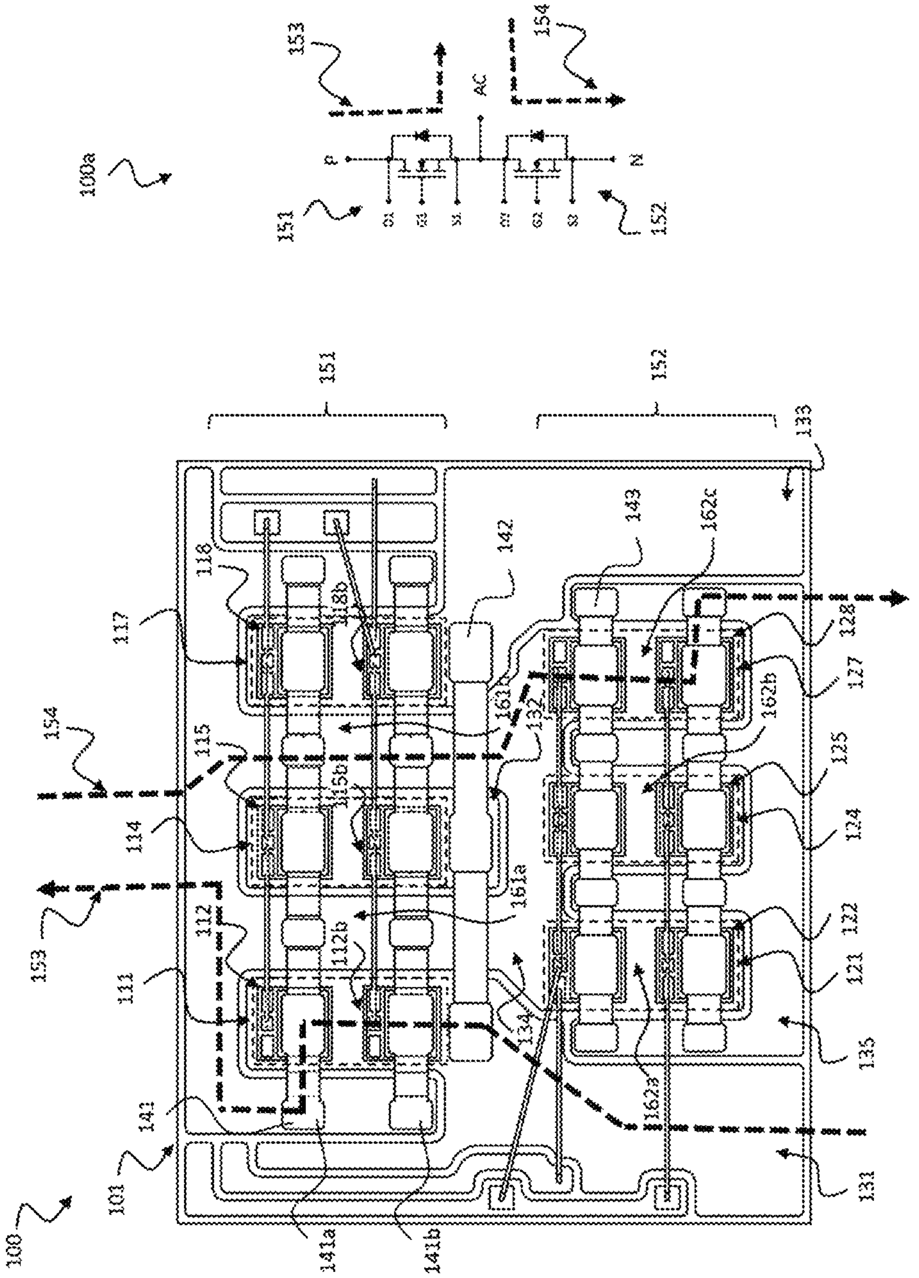
FIG. 1 shows a circuit diagram illustrating a semiconductor arrangement 100 according to the disclosure.

FIG. 1 shows a circuit diagram illustrating a semiconductor arrangement 100 according to the disclosure.

The semiconductor arrangement 100 forms a switching circuit 100*a* comprising a first switch 151 and a second switch 152 connected in series as illustrated on the right side of FIG. 1. The first switch 151 is connected between a first terminal P and a third terminal AC.

Figure 2:
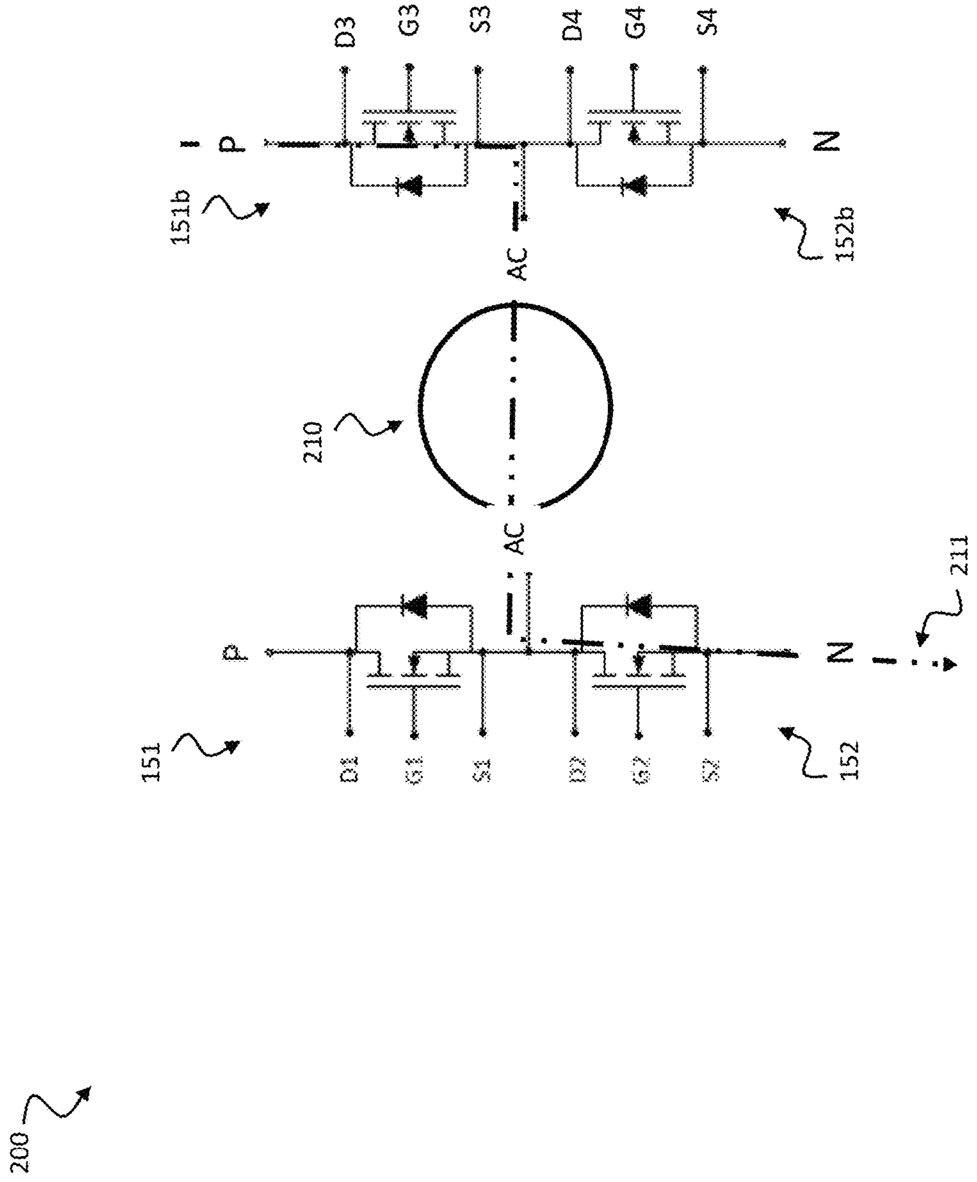
FIG. 2 shows a schematic diagram illustrating an H-bridge circuit 200 using semiconductor arrangements according to the disclosure.

The second switch 152 is connected between a second terminal N and the third terminal AC. For example, the switching circuit 100*a* may switch a DC voltage between first and second terminals P and N to an AC voltage at the third terminal AC. A first current path 153 through first switch 151 is established from first terminal P to third terminal AC. A second current path 154 through second switch 152 is established from third terminal AC to second terminal N. Both, first and second current paths 153, 154 are illustrated in the semiconductor arrangement 100. The first switch 151 may implement a high-side switch, for example. The second switch 152 may implement a low-side switch, for example. Both switches 151, 152 may implement a half bridge or part of a full H-bridge as shown in FIG. 2.

The first switch 151 may be implemented by a field effect transistor (FET) having a drain terminal D1, a source terminal S1 and a gate terminal G1 and a diode connected in parallel to the FET. Alternatively, an insulated gate bipolar transistor (IGBT) may be used instead of the FET. The source terminal S1 may form a first load electrode as described in the following. The drain terminal D1 may form a second load electrode as described in the following. The gate terminal G1 may form a control electrode.

The semiconductor arrangement 100 comprises: a substrate 101, a first group of semiconductor elements 111, 114, 117 and a second group of semiconductor elements 121, 124, 127.

The first group of semiconductor elements 111, 114, 117 may comprise multiple semiconductor elements, for example a number of six semiconductor elements as shown in FIG. 1. It understands that the first group may also have any other number of semiconductor elements, for example nine, twelve, fifteen or even only three elements.

The second group of semiconductor elements 112, 124, 127 may comprise multiple semiconductor elements, for example a number of six semiconductor elements as shown in FIG. 1. It understands that the second group may also have any other number of semiconductor elements, for example nine, twelve, fifteen or even only three elements. In one example, the number of semiconductor elements of the first group may correspond to the number of semiconductor elements of the second group but this is not a restriction. For example, the first group may have three semiconductor elements and the second group may have six semiconductor elements or any other configuration is possible as well.

The substrate 101 has a top side and a bottom side opposite to the top side.

The first group of semiconductor elements 111, 114, 117 are forming a first switch 151, each semiconductor element of the first group comprising a load path formed between a first load electrode arranged on a first main surface of the semiconductor element and a second load electrode arranged on a second main surface opposite to the first main surface of the semiconductor element, wherein the first load electrode of each semiconductor element of the first group is placed on the top side of the substrate.

The second group of semiconductor elements 121, 124, 127 are forming a second switch, each semiconductor element of the second group comprising a load path formed between a first load electrode arranged on a first main surface of the semiconductor element and a second load electrode arranged on a second main surface opposite to the first main surface of the semiconductor element, wherein the first load electrode of each semiconductor element of the second group is placed on the top side of the substrate 101.

The substrate 101 comprises a first electrically conductive area 131 on the top side of the substrate, accommodating at least a first semiconductor element 112 of the first group of semiconductor elements 111, 114, 117.

The substrate 101 comprises a second electrically conductive area 132 on the top side of the substrate, insulated from the first area, the second area accommodating at least a second semiconductor element 115 of the first group of semiconductor elements 111, 114, 117.

The substrate 101 comprises a third electrically conductive area 133 on the top side of the substrate, insulated from the first area and the second area, the third area accommodating at least a third semiconductor element 118 of the first group of semiconductor elements 111, 114, 117.

The substrate 101 comprises a fourth electrically conductive area 134 insulated from the first area, the second area and the third area. The fourth area 134 accommodates at least a first semiconductor element 122, a second semiconductor element 125 and a third semiconductor element 128 of the second group of semiconductor elements 121, 124, 127.

The semiconductor arrangement 100 further comprises a first electrical connection line 141 configured to electrically connect the second load electrodes of the semiconductor elements of the first group 111, 114, 117 with each other and with the fourth area 134 of the substrate.

The semiconductor arrangement 100 comprises a second electrical connection line 143 configured to electrically connect the second load electrodes of the semiconductor elements of the second group 121, 124, 127 with each other.

The semiconductor arrangement 100 comprises a third electrical connection line 142 configured to electrically connect the first area 131, the second area 132 and the third area 133 of the substrate.

The first electrical connection line 141, the second electrical connection line 143, the third electrical connection line 142 and the fourth area 134 of the substrate 101 are dimensioned according to a symmetry criterion to enable a simultaneous current flow through the load paths of the semiconductor elements of the first group 111, 114, 117 as well as a simultaneous current flow through the load paths of the semiconductor elements of the second group 121, 124, 127.

The fourth area 134 of the substrate may be dimensioned to separate the first area 131, the second area 132 and the third area 133 of the substrate from each other.

The fourth area 134 of the substrate may comprise a comb-shaped structure having first teeth 161*a*, 161*b* and second teeth 162*a*, 162*b*, 162*c*. The first teeth 161*a*, 161*b* of the comb-shaped structure may be dimensioned to separate the first area 131, the second area 132 and the third area 133 of the substrate from each other. The second teeth 162*a*, 162*b*, 162*c* of the comb-shaped structure may be dimensioned to accommodate the semiconductor element 122, the second semiconductor element 125 and the third semiconductor element 128 of the second group of semiconductor elements 121, 124, 127.

The second teeth 162*a*, 162*b*, 162*c* of the comb-shaped structure may be formed opposite to the first teeth 161*a*, 161*b* of the comb-shaped structure.

The second teeth 162*a*, 162*b*, 162*c* of the comb-shaped structure may be sequentially and equidistantly arranged on the top side of the substrate 101.

The first electrically conductive area 131, the second electrically conductive area 132 and the third electrically conductive area 133 may be sequentially arranged on the top side of the substrate 101.

A distance between the first electrically conductive area 131 and the second electrically conductive area 132 on the top side of the substrate 101 may correspond to a distance between the second electrically conductive area 132 and the third electrically conductive area 133 on the top side of the substrate.

The first electrical connection line 141 may comprises a first part 141*a* configured to electrically connect the second load electrodes of the first semiconductor element 112, the second semiconductor element 115 and the third semiconductor element 118 of the first group of semiconductor elements 111, 114, 117 with each other. The first part 141*a* of the first electrical connection line 141 may be dimensioned to form a straight connection line with respect to the top side of the substrate 101.

The first electrical connection line 141 may comprise a second part 141*b* configured to electrically connect the second load electrodes of another first semiconductor element 112*b* arranged on the first electrically conductive area 131, another second semiconductor element 115*b* arranged on the second electrically conductive area 132 and another third semiconductor element 118*b* arranged on the third electrically conductive area 131.

The second part 141*b* of the first electrical connection line 141 may be dimensioned to form a straight connection line with respect to the top side of the substrate 101.

The third electrical connection line 142 may be dimensioned to form a straight connection line with respect to the top side of the substrate 101.

The semiconductor arrangement 100 may comprise a fifth electrically conductive area 135 insulated from the first area 131, the second area 132, the third area 133 and the fourth area 134. The second electrical connection line 143 may be configured to electrically connect the second load electrodes of the semiconductor elements of the second group 121, 124, 127 with the fifth area 135.

Figure 3:
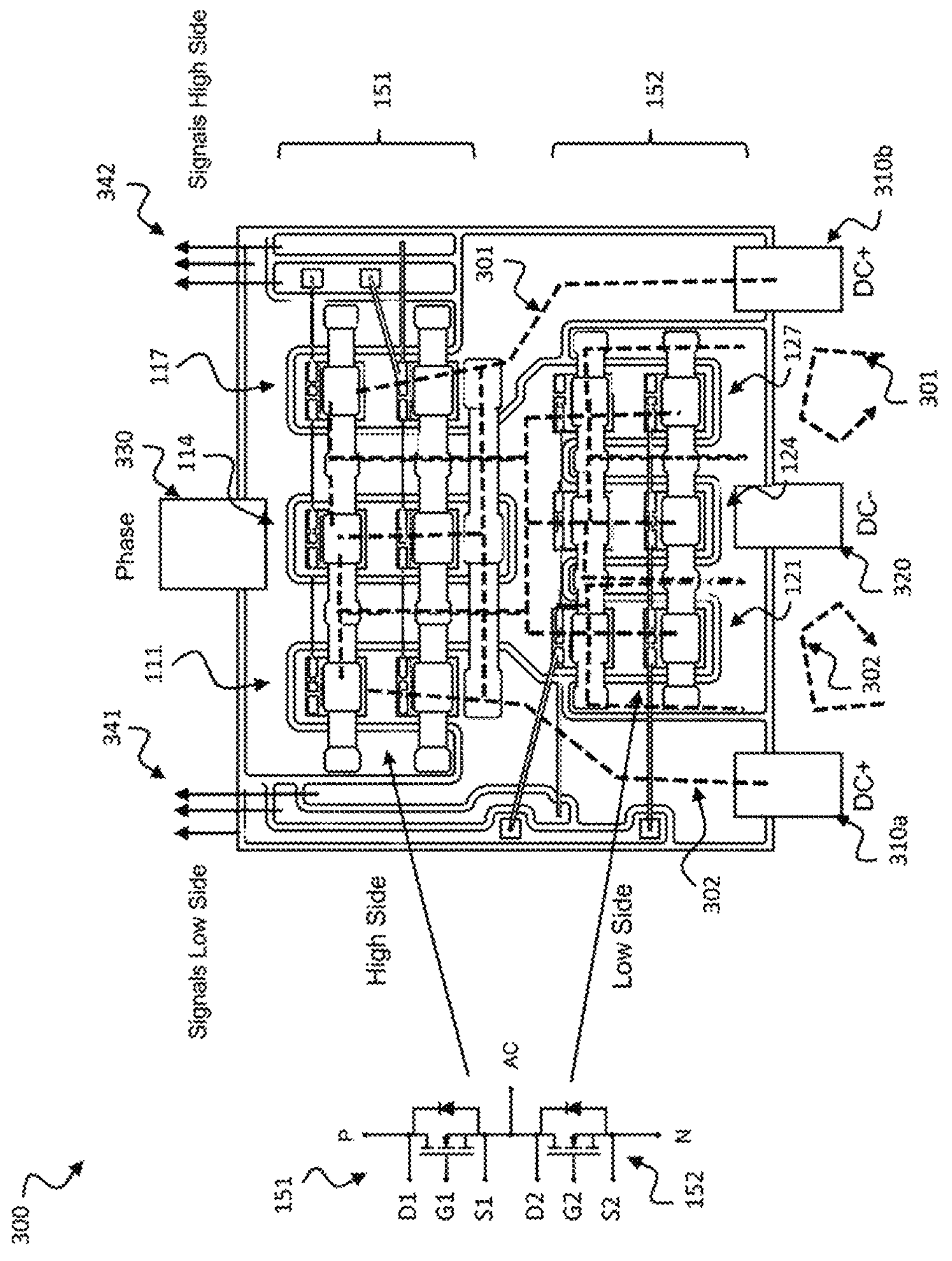
FIG. 3 shows a circuit diagram illustrating a semiconductor arrangement 300 according to the disclosure.

The semiconductor arrangement 100 may comprise a first lead frame 310*b* configured to electrically connect the third area 133 to a first external terminal, e.g. terminal DC+ as shown in FIG. 3. The first lead frame 310*b* may be welded on the third area 133 of the substrate 101, for example.

The semiconductor arrangement 100 may comprise a second lead frame 320 as shown in FIG. 3 configured to electrically connect the fifth area 135 to a second external terminal, e.g. terminal DC− as shown in FIG. 3. The second lead 320 frame may be welded on the fifth area 135 of the substrate 101, for example.

The semiconductor arrangement 100 may comprise a third lead frame 330 configured to electrically connect the fourth area 134 to a third external terminal, e.g. Phase as shown in FIG. 3. The third lead frame 330 may be welded on the fourth area 134 of the substrate 101, for example.

The semiconductor arrangement 100 may comprise a fourth lead frame 310*a* as shown in FIG. 3 configured to electrically connect the first area 131.

Figure 4:
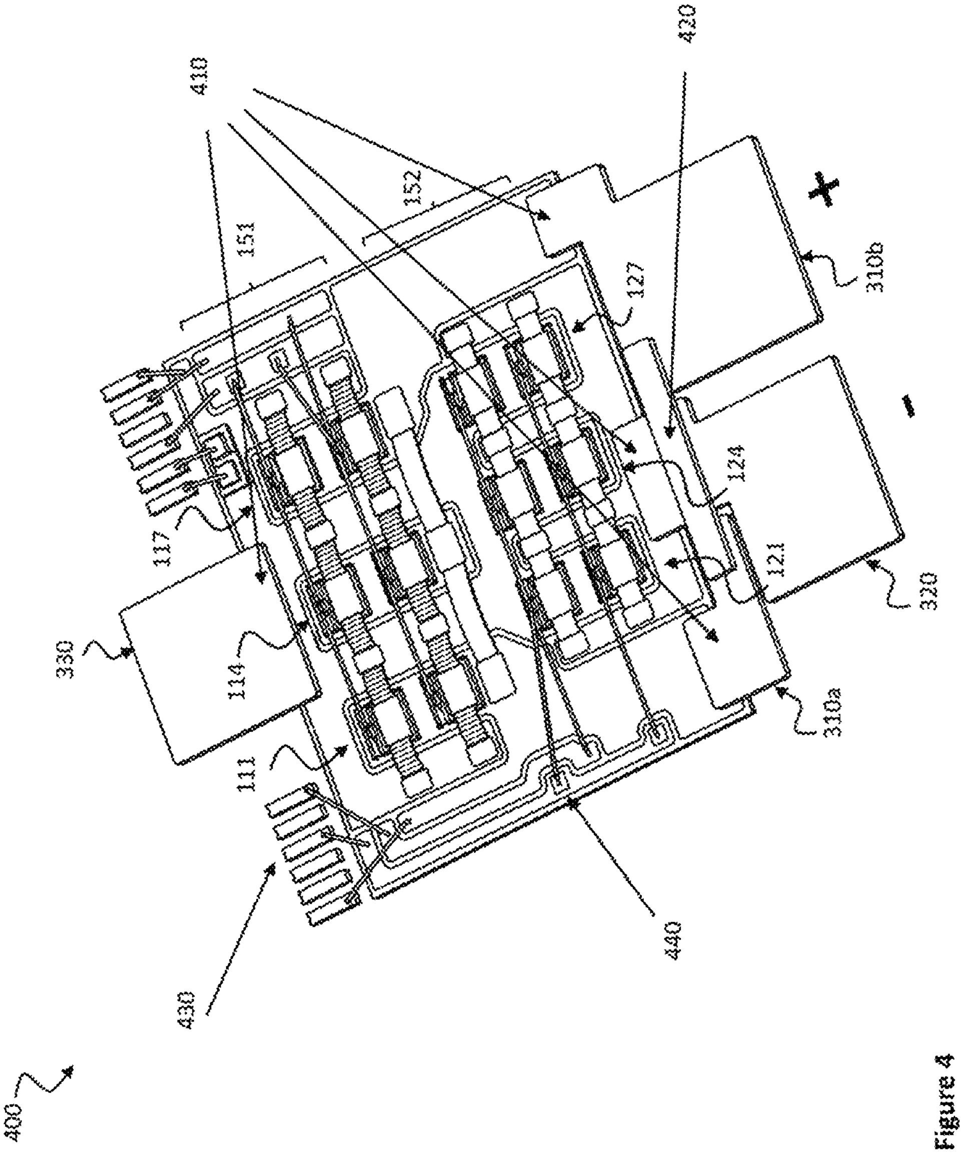
FIG. 4 shows a circuit diagram illustrating a semiconductor arrangement 400 according to the disclosure.

The semiconductor arrangement 100 may comprise an electrically conductive bridge 420 as shown in FIG. 4 configured to electrically connect the fourth lead frame 310*a* with the first lead frame 310*b* by bridging the second lead frame 320.

The semiconductor arrangement 100 may comprise a mold compound (not shown in FIG. 1) embedding the first group of semiconductor elements 111, 114, 117, the second group of semiconductor elements 121, 124, 127, the first electrical connection line 141, the second electrical connection line 143 and the third electrical connection line 142.

The semiconductor elements of the first group of semiconductor elements 111, 114, 117 and the semiconductor element of the second group of semiconductor elements 121, 124, 127 may be Silicon Carbide semiconductors, for example.

The semiconductor arrangement 100 may form a single side cooled molded power module, e.g. for automotive applications.

The concept of this implementation is using a clip (as shown by the third electrical connection line 142) to connect collector of third/middle row of chips, 114. The arrangement in three columns 121, 124, 128 on the low side 152 is accordingly in the columns without need for a clip. Aside a clip also ribbon bond(s) or standard wire bond(s) can be applied.

FIG. 2 shows a schematic diagram illustrating an H-bridge circuit 200 using semiconductor arrangements according to the disclosure.

The H-bridge circuit 200 can be implemented by two pair of switches 151, 152 as described above with respect to FIG. 1. For example, the semiconductor arrangement 100 described above with respect to FIG. 1 may form the two left side switches 151, 152 and another semiconductor arrangement 100 as described above with respect to FIG. 1 may form the two right side switches 151*b*, 152*b*.

A load 210, for example, a motor may be connected between the left side pair of switches 151, 152 and the right side pair of switches 151*b*, 152*b*. Based on switching the switches 151, 152, 151*b*, 152*b*, an alternating current path 211 is established to deliver an AC current to the load 210.

FIG. 3 shows a circuit diagram illustrating a semiconductor arrangement 300 according to the disclosure.

The semiconductor arrangement 300 corresponds to the semiconductor arrangement 100 described above with respect to FIG. 1, but is additionally provided with external leads 310*a*, 310*b*, 320, 330 to provide external connections for the conducting areas 131, 133, 134, 135.

The semiconductor arrangement 300 comprises a first lead frame 310*b* configured to electrically connect the third area 133 to a first external terminal, e.g. terminal DC+. This terminal DC+ may correspond to the terminal P as depicted in FIG. 2. The first lead frame 310*b* may be welded on the third area 133 of the substrate 101, for example.

The semiconductor arrangement 300 comprises a second lead frame 320 configured to electrically connect the fifth area 135 to a second external terminal, e.g. terminal DC−. This terminal DC− may correspond to the terminal N as depicted in FIG. 2. The second lead 320 frame may be welded on the fifth area 135 of the substrate 101, for example.

The semiconductor arrangement 300 comprises a third lead frame 330 configured to electrically connect the fourth area 134 to a third external terminal, e.g. Phase. This Phase may correspond to the AC terminal for connecting the load 210 as shown in FIG. 2. The third lead frame 330 may be welded on the fourth area 134 of the substrate 101, for example.

The semiconductor arrangement 300 comprises a fourth lead frame 310*a* configured to electrically connect the first area 131 to a fourth external terminal, e.g. terminal DC+. This fourth external terminal may be at the same electrical potential as the first external terminal, i.e. DC+. This terminal DC+ may correspond to the terminal P as depicted in FIG. 2. Both terminals of DC+ may be arranged at different corners of the semiconductor arrangement 300.

The semiconductor arrangement 300 may comprise an electrically conductive bridge 420 as shown in FIG. 4 configured to electrically connect the fourth lead frame 310*a* with the first lead frame 310*b* which are at the same electrical potential, i.e. DC+, by bridging the second lead frame 320 which may be at the inverse electrical potential, i.e. DC−.

As described above with respect to FIG. 1, the semiconductor arrangement 300 may comprise a mold compound (not shown in FIG. 3) embedding the first group of semiconductor elements 111, 114, 117, the second group of semiconductor elements 121, 124, 127, the first electrical connection line 141, the second electrical connection line 143 and the third electrical connection line 142.

The semiconductor elements of the first group of semiconductor elements 111, 114, 117 and the semiconductor element of the second group of semiconductor elements 121, 124, 127 may be Silicon Carbide semiconductors, for example. Alternatively all semiconductor elements may be Silicon semiconductors.

The semiconductor arrangement 300 may form a single side cooled molded power module, e.g. for automotive, industrial or consumer electronic applications.

Due to this specific configuration of the semiconductor arrangement 300, where the first electrical connection line 141, the second electrical connection line 143, the third electrical connection line 142 and the fourth area 134 of the substrate 101 are dimensioned according to a symmetry criterion, this configuration enable a simultaneous current flow 301, 302 through the load paths of the semiconductor elements of the first group 111, 114, 117 as well as a simultaneous current flow 301, 302 through the load paths of the semiconductor elements of the second group 121, 124, 127.

The current flows 301, 302 are illustrated in FIG. 3. It can be seen that the current paths through the semiconductor elements are symmetrically formed for both current paths, i.e. the left side current path 302 and the right side current path 301.

The left side current path 302 is established from left side DC+ via the first electrically conductive area 131, the first group of semiconductor elements 111, 114, 117, the first electrical connection line 141, the fourth electrically conductive area 134, the second group of semiconductor elements 121, 124, 127, the second electrical connection line 143, the fifth electrically conductive area 135 to terminal DC−.

The right side current path 301 is similarly established from right side DC+ via the first electrically conductive area 131, the first group of semiconductor elements 111, 114, 117, the first electrical connection line 141, the fourth electrically conductive area 134, the second group of semiconductor elements 121, 124, 127, the second electrical connection line 143, the fifth electrically conductive area 135 to terminal DC−.

The first group of semiconductor elements 111, 114, 117 may form the high side switch which can be controlled by high side signals 342. The second group of semiconductor elements 121, 124, 127 may form the low side switch which can be controlled by low side signals 341.

Each semiconductor element of the first group of semiconductor elements 111, 114, 117 may comprise a control electrode which can be controlled by the high side signals 342. For example, the control electrodes of the semiconductor elements of the first group of semiconductor elements 111, 114, 117 may be connected by a connection line with the high side signals 342 for simultaneously controlling the respective semiconductor elements as shown in FIG. 3.

Similarly, each semiconductor element of the second group of semiconductor elements 121, 124, 127 may comprise a control electrode which can be controlled by the low side signals 341. For example, the control electrodes of the semiconductor elements of the second group of semiconductor elements 121, 124, 127 may be connected by a connection line with the low side signals 341 for simultaneously controlling the respective semiconductor elements as shown in FIG. 3.

FIG. 4 shows a circuit diagram illustrating a semiconductor arrangement 400 according to the disclosure.

The semiconductor arrangement 400 corresponds to the semiconductor arrangement 300 described above with respect to FIG. 3, but is beside the welded lead frame 410 additionally provided with an internal DC+ bridge 420, a wire bond pull out design 430 and optional gate resistors with chip in series 440.

The semiconductor arrangement 400 comprises an electrically conductive bridge 420 configured to electrically connect the fourth lead frame 310*a* with the first lead frame 310*b* which are at the same electrical potential, i.e. DC+, by bridging the second lead frame 320 which may be at the inverse electrical potential, i.e. DC−.

As described above with respect to FIG. 1, the semiconductor arrangement 400 may comprise a mold compound (not shown in FIG. 4) embedding the first group of semiconductor elements 111, 114, 117, the second group of semiconductor elements 121, 124, 127, the first electrical connection line 141, the second electrical connection line 143 and the third electrical connection line 142.

The semiconductor elements of the first group of semiconductor elements 111, 114, 117 and the semiconductor elements of the second group of semiconductor elements 121, 124, 127 may be Silicon Carbide semiconductors, for example. Alternatively, all semiconductor elements may be Silicon semiconductors.

The semiconductor arrangement 300 may form a single side cooled molded power module, e.g. for automotive, industrial or consumer electronic applications.

Due to this specific configuration of the semiconductor arrangement 400, where the first electrical connection line 141, the second electrical connection line 143, the third electrical connection line 142 and the fourth area 134 of the substrate 101 are dimensioned according to a symmetry criterion, this configuration enables a simultaneous current flow 301, 302 through the load paths of the semiconductor elements of the first group 111, 114, 117 as well as a simultaneous current flow 301, 302 through the load paths of the semiconductor elements of the second group 121, 124, 127, as described above with respect to FIG. 3.

As described above with respect to FIG. 3, the current paths through the semiconductor elements are symmetrically formed for both current paths, i.e. the left-side current path 302 and the right-side current path 301.

The semiconductor arrangement 400 can be characterized by DC+/DC− power pin arrangement and internal DC+ bridge. The internal DC+ Bridge 420 reduces stray inductance and ringing by a symmetrical cancellation. The wire bond pull out design 430 provides the technical advantage of design flexibility. Leads for signal pins are not attached to the leadframe by welding, soldering or sintering and substrate is connected to signal pins by wire bonds. This design improves routing flexibility as certain regions on the substrate can be crossed in electrical save distance.

Thus, the novel design provides a high symmetrical substrate layout that may be applied for molded single side cooled module, for example, enabling reliable switching of SiC chips within module. It understands that also Si chips or chips based on other semiconductor technologies may be utilized in this novel design.

Figure 5:
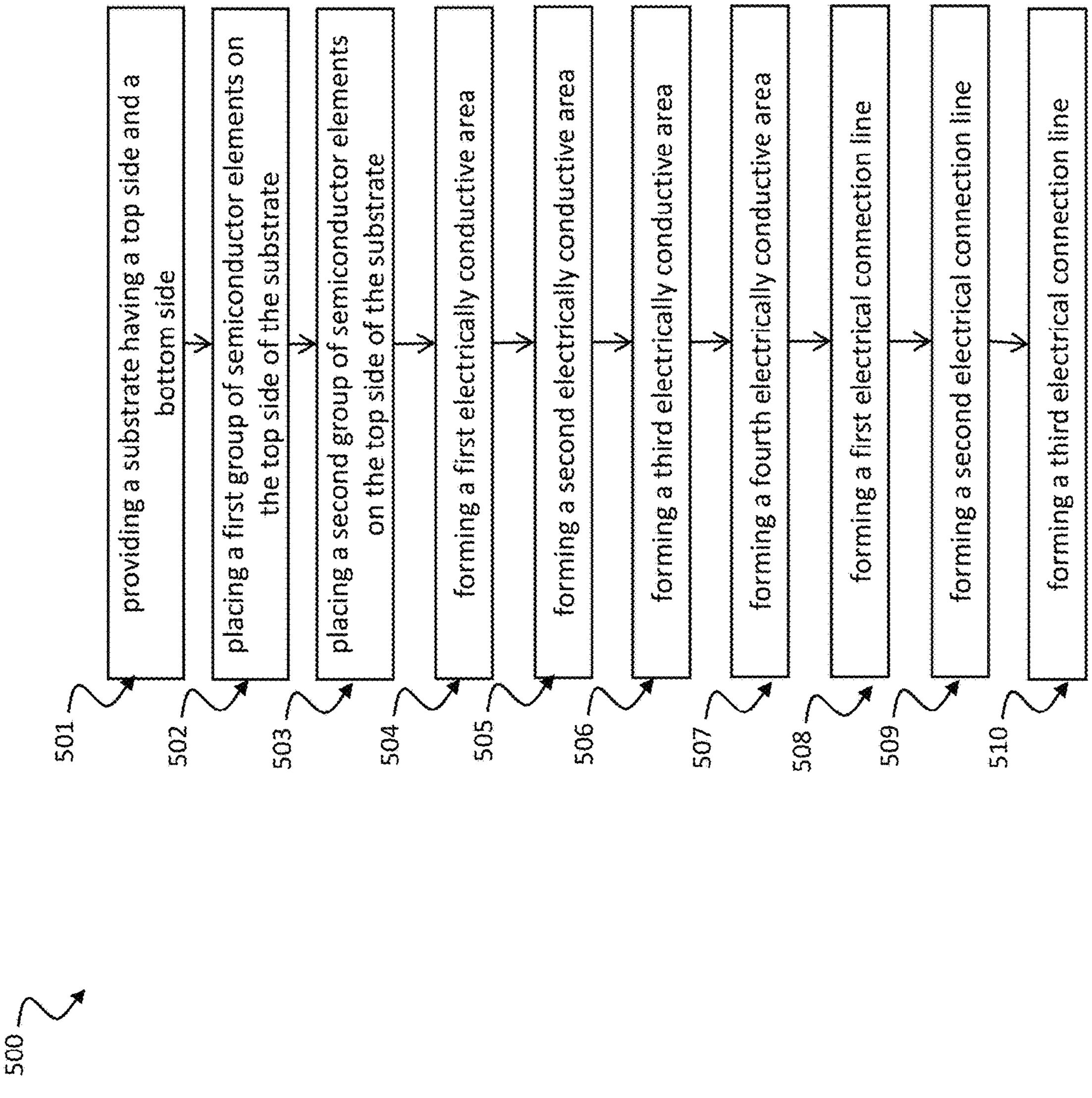
FIG. 5 shows a schematic diagram illustrating a method 500 for producing a semiconductor arrangement according to the disclosure.

FIG. 5 shows a schematic diagram illustrating a method 500 for producing a semiconductor arrangement according to the disclosure.

The method 500 may be used for producing a semiconductor arrangement 100, 300, 400 as described above with respect to FIGS. 1 to 4.

The method 500 comprises: providing 501 a substrate 101 having a top side and a bottom side opposite to the top side.

The method 500 comprises: placing 502 a first load electrode of each semiconductor element of a first group of semiconductor elements 111, 114, 117 on the top side of the substrate, wherein the first group of semiconductor elements 111, 114, 117 form a first switch, each semiconductor element of the first group comprising a load path formed between a first load electrode arranged on a first main surface of the semiconductor element and a second load electrode arranged on a second main surface opposite to the first main surface of the semiconductor element.

The method 500 comprises: placing 503 a first load electrode of each semiconductor element of a second group of semiconductor elements 121, 124, 127 on the top side of the substrate, wherein the second group of semiconductor elements 121, 124, 127 forms a second switch, each semiconductor element of the second group comprising a load path formed between a first load electrode arranged on a first main surface of the semiconductor element and a second load electrode arranged on a second main surface opposite to the first main surface of the semiconductor element.

The method 500 comprises: forming 504 a first electrically conductive area 131 on the top side of the substrate, the first electrically conductive area 131 accommodating at least a first semiconductor element 112 of the first group of semiconductor elements 111, 114, 117.

The method 500 comprises: forming 505 a second electrically conductive area 132 on the top side of the substrate, the second area 132 insulated from the first area 131, the second area accommodating at least a second semiconductor element 115 of the first group of semiconductor elements 111, 114, 117;

The method 500 comprises: forming 506 a third electrically conductive area 133 on the top side of the substrate, the third area 133 insulated from the first area and the second area, the third area accommodating at least a third semiconductor element 118 of the first group of semiconductor elements 111, 114, 117.

The method 500 comprises: forming 507 a fourth electrically conductive area 134 insulated from the first area, the second area and the third area, the fourth area accommodating at least a first semiconductor element 122, a second semiconductor element 125 and a third semiconductor element 128 of the second group of semiconductor elements 121, 124, 127.

The method 500 comprises: forming 508 a first electrical connection line 141 electrically connecting the second load electrodes of the semiconductor elements of the first group 111, 114, 117 with each other and with the fourth area 134 of the substrate.

The method 500 comprises: forming 509 a second electrical connection line 143 electrically connecting the second load electrodes of the semiconductor elements of the second group 121, 124, 127 with each other.

The method 500 comprises: forming 510 a third electrical connection line 142 electrically connecting the first area 131, the second area 132 and the third area 133 of the substrate, wherein the first electrical connection line 141, the second electrical connection line 143, the third electrical connection line 142 and the fourth area 134 of the substrate 101 are dimensioned according to a symmetry criterion to enable a simultaneous current flow through the load paths of the semiconductor elements of the first group 111, 114, 117 as well as a simultaneous current flow through the load paths of the semiconductor elements of the second group 121, 124, 127.

While a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the terms "exemplary", "for example" and "e.g." are merely meant as an example, rather than the best or optimal. The terms "coupled" and "connected", along with derivatives may have been used. It should be understood that these terms may have been used to indicate that two elements cooperate or interact with each other regardless whether they are in direct physical or electrical contact, or they are not in direct contact with each other.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence.

Many alternatives, modifications, and variations will be apparent to those skilled in the art in light of the above teachings. Of course, those skilled in the art readily recognize that there are numerous applications of the invention beyond those described herein. While the present invention has been described with reference to one or more particular embodiments, those skilled in the art recognize that many changes may be made thereto without departing from the scope of the present invention. It is therefore to be understood that within the scope of the appended claims and their equivalents, the invention may be practiced otherwise than as specifically described herein.

What is claimed is:

1. A semiconductor arrangement, comprising:

a substrate having a top side and a bottom side opposite to the top side;

a first group of semiconductor elements forming a first switch, wherein each respective semiconductor element of the first group comprises a load path formed between a first load electrode of the respective semiconductor element and a second load electrode of the respective semiconductor element, wherein the first load electrode of each semiconductor element of the first group is placed on the top side of the substrate;

a second group of semiconductor elements forming a second switch, wherein each respective semiconductor element of the second group comprises a load path formed between a first load electrode of the respective semiconductor element and a second load electrode of the respective semiconductor element, wherein the first load electrode of each semiconductor element of the second group is placed on the top side of the substrate;

wherein the substrate comprises:

a first electrically conductive area on the top side of the substrate, on which at least a first semiconductor element of the first group of semiconductor elements is arranged;

a second electrically conductive area on the top side of the substrate, on which at least a second semiconductor element of the first group of semiconductor elements is arranged, the second electrically conductive area being insulated from the first electrically conductive area;

a third electrically conductive area on the top side of the substrate, on which at least a third semiconductor element of the first group of semiconductor elements is arranged, the third electrically conductive area being insulated from the first electrically conductive area and the second electrically conductive area;

a fourth electrically conductive area, on which at least a first semiconductor element, a second semiconductor element and a third semiconductor element of the second group of semiconductor elements are arranged, the fourth electrically conductive area being insulated from the first electrically conductive area, the second electrically conductive area, and the third electrically conductive area;

wherein the semiconductor arrangement further comprises:

a first electrical connection line configured to electrically connect the second load electrodes of the semiconductor elements of the first group with each other and with the fourth electrically conductive area of the substrate;

a second electrical connection line configured to electrically connect the second load electrodes of the semiconductor elements of the second group with each other; and a third electrical connection line configured to electrically connect the first electrically conductive area, the second electrically conductive area and the third electrically conductive area of the substrate;

wherein the first electrical connection line, the second electrical connection line, the third electrical connection line and the fourth electrically conductive area of the substrate are dimensioned according to a symmetry criterion, to enable a simultaneous current flow through the load paths of the semiconductor elements of the first group, and to enable a simultaneous current flow through the load paths of the semiconductor elements of the second group.

2. The semiconductor arrangement of claim 1, wherein the fourth electrically conductive area of the substrate is dimensioned to separate the first electrically conductive area, the second electrically conductive area and the third electrically conductive area of the substrate from each other.

3. The semiconductor arrangement of claim 1, wherein the fourth electrically conductive area of the substrate comprises a comb-shaped structure, wherein first teeth of the comb-shaped structure are dimensioned to separate the first electrically conductive area, the second electrically conductive area and the third electrically conductive area of the substrate from each other.

4. The semiconductor arrangement of claim 3, wherein the semiconductor element, the second semiconductor element and the third semiconductor element of the second group of semiconductor elements are arranged on second teeth of the comb-shaped structure.

5. The semiconductor arrangement of claim 4, wherein the second teeth of the comb-shaped structure are on an opposite side of the third electrical connection line than the first teeth of the comb-shaped structure.

6. The semiconductor arrangement of claim 4, wherein the second teeth of the comb-shaped structure are sequentially and equidistantly arranged on the top side of the substrate.

7. The semiconductor arrangement of claim 1, wherein the first electrically conductive area, the second electrically conductive area and the third electrically conductive area are sequentially arranged on the top side of the substrate.

8. The semiconductor arrangement of claim 7, wherein a distance between the first electrically conductive area and the second electrically conductive area on the top side of the substrate corresponds to a distance between the second electrically conductive area and the third electrically conductive area on the top side of the substrate.

9. The semiconductor arrangement of claim 1, wherein the first electrical connection line comprises a first part configured to electrically connect the second load electrodes of the first semiconductor element, the second semiconductor element and the third semiconductor element of the first group of semiconductor elements with each other.

10. The semiconductor arrangement of claim 9, wherein the first part of the first electrical connection line is dimensioned to form a straight connection line parallel to the top side of the substrate.

11. The semiconductor arrangement of claim 9, wherein the first electrical connection line comprises a second part configured to electrically connect the second load electrodes of another first semiconductor element arranged on the first electrically conductive area, another second semiconductor element arranged on the second electrically conductive area and another third semiconductor element arranged on the third electrically conductive area.

12. The semiconductor arrangement of claim 11, wherein the second part of the first electrical connection line is dimensioned to form a straight connection line parallel to the top side of the substrate.

13. The semiconductor arrangement of claim 1, wherein the third electrical connection line is dimensioned to form a straight connection line with respect to the top side of the substrate.

14. The semiconductor arrangement of claim 1, comprising:

a fifth electrically conductive area insulated from the first electrically conductive area, the second electrically conductive area, the third electrically conductive area and the fourth electrically conductive area, wherein the second electrical connection line is configured to electrically connect the second load electrodes of the semiconductor elements of the second group with the fifth electrically conductive area.

15. The semiconductor arrangement of claim 14, comprising:

a first lead frame configured to electrically connect the third electrically conductive area to a first external terminal, wherein the first lead frame is welded on the third electrically conductive area of the substrate;

a second lead frame configured to electrically connect the fifth electrically conductive area to a second external terminal, wherein the second lead frame is welded on the fifth electrically conductive area of the substrate; and a third lead frame configured to electrically connect the fourth electrically conductive area to a third external terminal, wherein the third lead frame is welded on the fourth electrically conductive area of the substrate.

16. The semiconductor arrangement of claim 15, comprising:

a fourth lead frame configured to electrically connect the first electrically conductive area; and an electrically conductive bridge configured to electrically connect the fourth lead frame with the first lead frame by bridging the second lead frame.

17. The semiconductor arrangement of claim 1, comprising:

a mold compound embedding the first group of semiconductor elements, the second group of semiconductor elements, the first electrical connection line, the second electrical connection line and the third electrical connection line.

18. The semiconductor arrangement of claim 1, wherein the semiconductor elements of the first group of semiconductor elements and the semiconductor element of the second group of semiconductor elements are Silicon Carbide semiconductors.

19. The semiconductor arrangement of claim 1, forming a single side cooled molded power module for automotive applications.

* * * * *